(12) United States Patent
Taracila et al.

(10) Patent No.: US 9,645,207 B2
(45) Date of Patent: May 9, 2017

(54) ADJUSTABLE MRI HEAD COIL APPARATUS AND MRI SYSTEM

(75) Inventors: Victor Taracila, Aurora, OH (US);
Miguel A. Navarro, Aurora, OH (US);
Darren C. Gregan, Aurora, OH (US);
Kolman Juhasz, Aurora, OH (US);
Sarah G. Leversee, Aurora, OH (US);
Fraser J. Robb, Aurora, OH (US)

(73) Assignee: General Electric Company, Schenectady, NY (US)

( * ) Notice: Subject to any disclaimer, the term of this patent is extended or adjusted under 35 U.S.C. 154(b) by 987 days.

(21) Appl. No.: 13/246,938

(22) Filed: Sep. 28, 2011

(65) Prior Publication Data

US 2013/0076358 A1 Mar. 28, 2013

(51) Int. Cl.
*G01R 33/36* (2006.01)
*G01R 33/34* (2006.01)
*G01R 33/3415* (2006.01)
*G01R 33/48* (2006.01)

(52) U.S. Cl.
CPC .... *G01R 33/34084* (2013.01); *G01R 33/3415* (2013.01); *G01R 33/481* (2013.01)

(58) Field of Classification Search
CPC .......... G01R 33/3415; G01R 33/34084; G01R 33/34046; G01R 33/481; G01R 33/34007
USPC .................... 324/318; 600/410–422
See application file for complete search history.

(56) References Cited

U.S. PATENT DOCUMENTS

| | | | |
|---|---|---|---|
| 5,150,710 A | 9/1992 | Hall et al. | |
| 6,577,888 B1 * | 6/2003 | Chan et al. | 600/422 |
| 6,784,665 B1 * | 8/2004 | Chan et al. | 324/318 |
| 2005/0012502 A1 * | 1/2005 | Renz | 324/318 |
| 2008/0007259 A1 * | 1/2008 | Driemel | 324/260 |
| 2008/0088309 A1 * | 4/2008 | Eberler et al. | 324/318 |
| 2009/0203990 A1 * | 8/2009 | Noras | 600/410 |
| 2010/0329414 A1 * | 12/2010 | Zhu et al. | 378/4 |
| 2011/0074420 A1 * | 3/2011 | Ladebeck | 324/318 |
| 2012/0265052 A1 * | 10/2012 | Rohr et al. | 600/415 |
| 2013/0076358 A1 | 3/2013 | Taracila et al. | |

FOREIGN PATENT DOCUMENTS

| | | |
|---|---|---|
| CN | 1572244 A | 2/2005 |
| CN | 101089647 A | 12/2007 |
| CN | 101257846 A | 9/2008 |
| CN | 101950006 A | 1/2011 |

OTHER PUBLICATIONS

CN OA and English translation for Application No. 201210367381.8. Office Action dated Feb. 26, 2016, 44 pages.
Staubert et al. "An Integrated Head-Holder/Coil for Intraoperative MRI in Open Neurosurgery," Journal of Magnetic Resonance Imaging, Issue 11, pp. 564-567, 2000.

* cited by examiner

Primary Examiner — Melissa Koval
Assistant Examiner — Rishi Patel

(57) ABSTRACT

An adjustable MRI head coil apparatus and MRI system include a fixture and a plurality of plates attached to the fixture. Each of the plurality of plates includes a plurality of RF receive elements arranged in a fixed orientation. The adjustable MRI head coil apparatus and MRI system also include an actuator mechanism configured to adjust the relative position of each of the plurality of plates in order to fit a variety of different patient head sizes.

20 Claims, 3 Drawing Sheets

ADJUSTABLE MRI HEAD COIL APPARATUS AND MRI SYSTEM

FIELD OF THE INVENTION

This disclosure relates generally to an adjustable MRI head coil apparatus and an MRI system. The adjustable MRI head coil apparatus and MRI system includes a plurality of plates that are adjustable to accommodate a variety of different patient head sizes.

BACKGROUND OF THE INVENTION

Magnetic resonance imaging (MRI) is a medical imaging modality that can create images of the inside of a human body without using x-rays or other ionizing radiation. MRI uses a powerful magnet to create a strong, uniform, static magnetic field. When a human body, or part of a human body, is placed in the main magnetic field, the nuclear spins that are associated with the hydrogen nuclei in tissue or fat become polarized. This means that the magnetic moments that are associated with these spins become preferentially aligned along the direction of the main magnetic field, resulting in a small net tissue magnetization along that axis. An MRI system also comprises components called gradient coils that produce smaller amplitude, spatially varying magnetic fields when a current is applied to them. Typically, gradient coils are designed to produce a magnetic field component that is aligned along the z-axis and that varies linearly in amplitude with position along one of the x, y, or z-axes. The effect of a gradient coil is to create a small ramp on the magnetic field strength and, in turn, on the resonant frequency of the nuclear spins along a single axis. Three gradient coils with orthogonal axes are used to "spatially encode" the MRI signal by creating a signature resonance frequency at each location in the body. Typically a radio frequency (RF) body coil is used to create pulses of RF energy at or near the resonance frequency of the hydrogen nuclei. The RF body coil is used to add energy to the nuclear spins in a controlled fashion. As the nuclear spins then relax back to their rest energy state, they give up energy in the form of an RF signal. The RF signal is detected by one or more RF receive coils and is transformed into an image using a computer and known reconstruction algorithms.

The RF receive coil typically includes a large number of individual RF receive elements that may be arranged in a phased array. The size and relative orientations of each of the RF receive elements are tuned to provide the best results for a specific magnetic field strength. Conventional RF receive coils for imaging heads are typically rigid and optimized to fit a patient with a large head. However, in order to obtain the best signal-to-noise ratio, it is important to position the RF receive elements as close to patient's head as possible. Since typical head coils are designed to accommodate a large patient head, there is usually excess room when using a conventional head coil to image a smaller head. This may result in images of reduced image quality. Therefore, for these and other reasons, there is a need for an adjustable MRI head coil that adjusts to fit a wide range of head sizes.

BRIEF DESCRIPTION OF THE INVENTION

The above-mentioned shortcomings, disadvantages and problems are addressed herein which will be understood by reading and understanding the following specification.

In an embodiment, an adjustable MRI head coil apparatus includes a fixture and a plurality of plates. Each of the plurality of plates includes a plurality of RF receive elements arranged in a fixed orientation and each of the plurality of plates is attached to the fixture. The adjustable MRI head coil apparatus includes an actuator mechanism configured to adjust the relative position of each of the plurality of plates in order to allow the plurality of plates to fit a variety of different patient head sizes.

In an embodiment, an adjustable MRI head coil apparatus includes a fixture, a front plate including a first plurality of RF receive elements, and a first pivot connecting the front plate to the fixture. The adjustable MRI head coil apparatus includes a left plate including a second plurality of RF receive elements and a second pivot connecting the left plate to the fixture. The adjustable MRI head coil apparatus includes a right plate including a third plurality of RF receive elements and a third pivot connecting the right plate to the fixture. The adjustable MRI head coil apparatus also includes an actuator mechanism configured to adjust the position of the front plate, the left plate, and the right plate with respect to the fixture.

In another embodiment, an MRI system includes a superconducting magnet configured to generate a B0 field, an RF body coil disposed inside the superconducting magnet and an adjustable MRI head coil apparatus. The adjustable MRI head coil apparatus includes a fixture and a plurality of plates attached to the fixture. Each of the plurality of plates includes a plurality of RF receive elements arranged in a fixed orientation. The adjustable MRI head coil apparatus also includes an actuator mechanism configured to adjust the relative positioning of each of the plurality of plates with respect to the fixture in order to allow the plurality of plates to fit a variety of different patient head sizes.

Various other features, objects, and advantages of the invention will be made apparent to those skilled in the art from the accompanying drawings and detailed description thereof.

DETAILED DESCRIPTION OF THE INVENTION

In the following detailed description, reference is made to the accompanying drawings that form a part hereof, and in which is shown by way of illustration specific embodiments that may be practiced. These embodiments are described in sufficient detail to enable those skilled in the art to practice the embodiments, and it is to be understood that other embodiments may be utilized and that logical, mechanical, electrical and other changes may be made without departing from the scope of the embodiments. The following detailed description is, therefore, not to be taken as limiting the scope of the invention.

Figure 1:
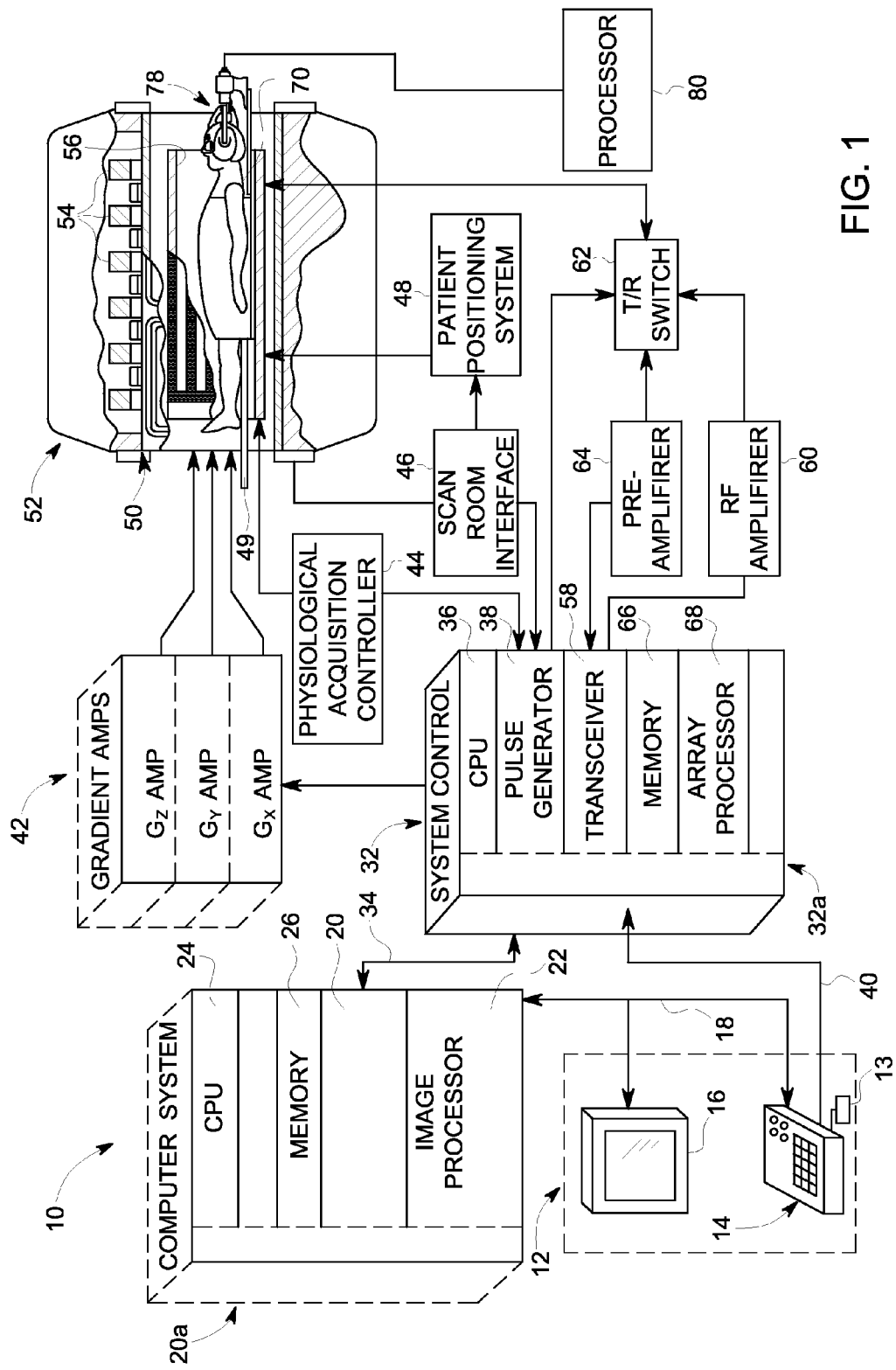
FIG. 1 is a schematic representation of a magnetic resonance imaging (MRI) system in accordance with an embodiment.

FIG. 1 is a schematic block diagram of an exemplary magnetic resonance imaging (MRI) system in accordance with an embodiment. The operation of MRI system 10 is controlled from an operator console 12 that includes a keyboard or other input device 13, a control panel 14, and a display 16. The console 12 communicates through a link 18 with a computer system 20 and provides an interface for an operator to prescribe MRI scans, display resultant images, perform image processing on the images, and archive data and images. The computer system 20 includes a number of modules that communicate with each other through electrical and/or data connections, for example, such as are provided by using a backplane 20a. Data connections may be direct wired links or may be fiber optic connections or wireless communication links or the like. The modules of the computer system 20 include an image processor module 22, a CPU module 24 and a memory module 26 which may include a frame buffer for storing image data arrays. In an alternative embodiment, the image processor module 22 may be replaced by image processing functionality on the CPU module 24. The computer system 20 is linked to archival media devices, permanent or back-up memory storage or a network. Computer system 20 may also communicate with a separate system control computer 32 through a link 34. The input device 13 can include a mouse, joystick, keyboard, track ball, touch activated screen, light wand, voice control, or any similar or equivalent input device, and may be used for interactive geometry prescription.

The system control computer 32 includes a set of modules in communication with each other via electrical and/or data connections 32a. Data connections 32a may be direct wired links, or may be fiber optic connections or wireless communication links or the like. In alternative embodiments, the modules of computer system 20 and system control computer 32 may be implemented on the same computer system or a plurality of computer systems. The modules of system control computer 32 include a CPU module 36 and a pulse generator module 38 that connects to the operator console 12 through a communications link 40. The pulse generator module 38 may alternatively be integrated into the scanner equipment (e.g., resonance assembly 52). It is through link 40 that the system control computer 32 receives commands from the operator to indicate the scan sequence that is to be performed. The pulse generator module 38 operates the system components that play out (i.e., perform) the desired pulse sequence by sending instructions, commands and/or requests describing the timing, strength and shape of the RF pulses and pulse sequences to be produced and the timing and length of the data acquisition window. The pulse generator module 38 connects to a gradient amplifier system 42 and produces data called gradient waveforms that control the timing and shape of the gradient pulses that are to be used during the scan. The pulse generator module 38 may also receive patient data from a physiological acquisition controller 44 that receives signals from a number of different sensors connected to the patient, such as ECG signals from electrodes attached to the patient. The pulse generator module 38 connects to a scan room interface circuit 46 that receives signals from various sensors associated with the condition of the patient and the magnet system. It is also through the scan room interface circuit 46 that a patient positioning system 48 receives commands to move the patient table 49 to the desired position for the scan.

The gradient waveforms produced by the pulse generator module 38 are applied to gradient amplifier system 42 which is comprised of $G_x$, $G_y$ and $G_z$ amplifiers. Each gradient amplifier excites a corresponding physical gradient coil in a gradient coil assembly 50 generally designated to produce the magnetic field gradient pulses used for spatially encoding acquired signals. The gradient coil assembly 50 forms part of a resonance assembly 52 that includes superconducting magnet 54. Resonance assembly 52 may include an RF body coil 56 and/or surface or local RF coils, such as adjustable MRI head coil apparatus 78. The coils 56, 78 of the RF coil assembly may be configured for both transmitting and receiving, for transmit-only, or for receive-only. The adjustable MRI head coil apparatus 78 may be an array of RF receive elements in which each RF receive element separately detects the MRI signals. The adjustable MRI head coil apparatus 78 will be described in additional detail hereinafter.

A patient or imaging subject 70 may be positioned within a cylindrical bore of the resonance assembly 52. A transceiver module 58 in the system control computer 32 produces pulses that are amplified by an RF amplifier 60 and coupled to the RF coils 56, 78 by a transmit/receive switch 62. The resulting signals emitted by the excited nuclei in the patient may be sensed by either of the RF coils 56, 78 and coupled through the transmit/receive switch 62 to a preamplifier 64. The amplified MR signals are demodulated, filtered and digitized in the receiver section of the transceiver 58. The transmit/receive switch 62 is controlled by a signal from the pulse generator module 38 to electrically connect the RF amplifier 60 to the RF body coil 56 during the transmit mode and to connect the preamplifier 64 to the RF body coil 56 during the receive mode. The transmit/receive switch 62 can also enable a separate RF coil to be used in either the transmit or receive mode. The MRI system 10 also includes a processor 80 communicatively connected to the adjustable MRI head coil apparatus 78. The processor 80 may be used to control the position of the adjustable MRI head coil apparatus 78. According to another embodiment, the processing functions performed by processor 80 may also be performed by other processors in the MRI system. According to other embodiments, an operator may use the operator console 12 in order to input commands to adjust the positioning of the adjustable MRI head coil apparatus 78 or the operator may input commands through a stand-alone control interface (not shown) for the adjustable MRI head coil apparatus 78.

The MR signals sensed by the RF body coil 56 and/or the MRI head coil apparatus 78 are digitized by the transceiver module 58 and transferred to a memory module 66 in the system control computer 32. Typically, frames of data corresponding to MR signals are stored temporarily in the memory module 66 until they are subsequently transformed to create images. An array processor 68 uses a known transformation method, most commonly a Fourier transform, to create images from the MR signals. These images are communicated through the link 34 to the computer system 20 where they are stored in memory. In response to commands received from the operator console 12, image data may be archived in long-term storage or it may be further processed by the image processor 22 and conveyed to the operator console 12 and presented on display 16.

As mentioned above, an RF body coil 56 may be used in a transmit mode to transmit RF excitation signals and a surface coil like MRI head coil apparatus 78 may be used in a receive mode to detect the signals emitted by the subject. A decoupling circuit (or circuits) is provided to decouple, or disable, the MRI head coil apparatus 78 during the transmit mode when the RF body coil 56 or a different RF transmit coil is transmitting RF excitation signals.

Figure 2:
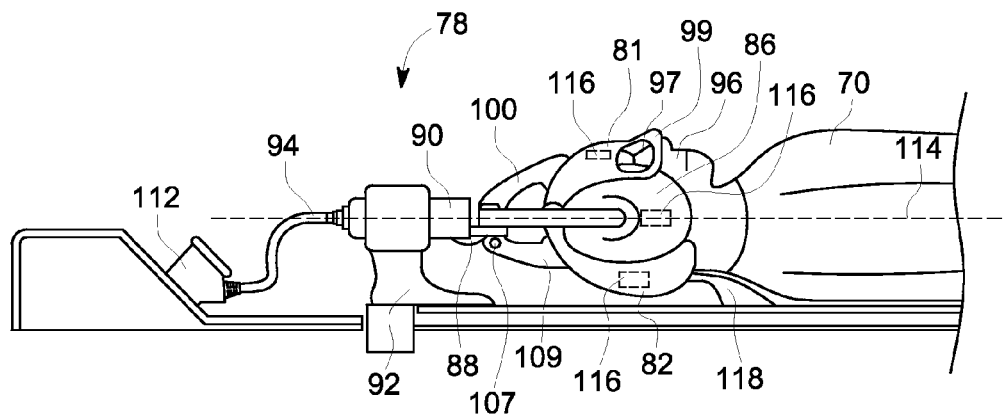
FIG. 2 is a schematic representation of a side view an adjustable MRI head coil apparatus in accordance with an embodiment.
Figure 3:
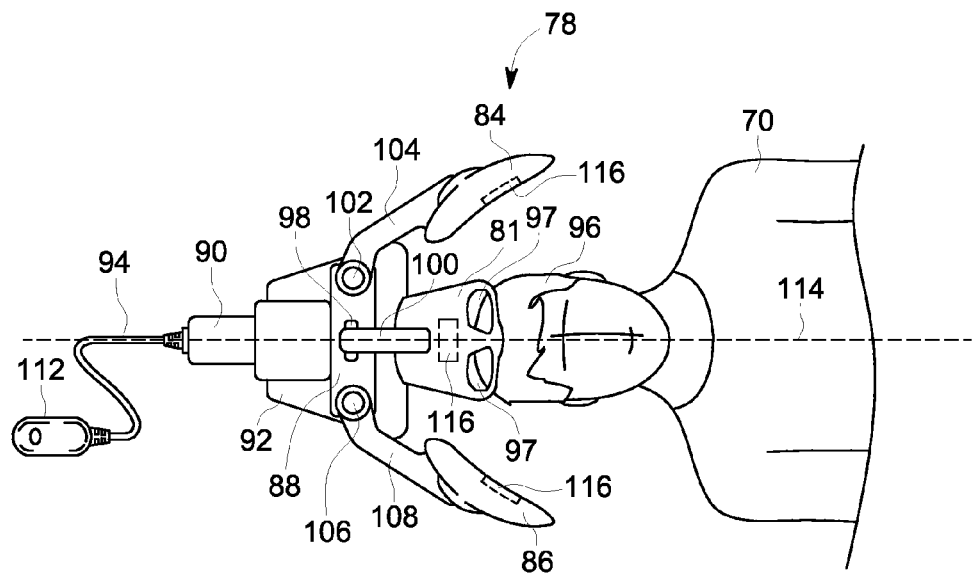
FIG. 3 is a schematic representation of a top view of an adjustable MRI head coil apparatus in accordance with an embodiment.

Referring to FIG. 2, a schematic representation of a side view of the adjustable MRI head coil apparatus 78 from FIG. 1 is shown. The adjustable MRI head coil apparatus 78 is depicted in a closed position in FIG. 2. Referring to FIG. 3, a schematic representation of a top view of the adjustable MRI head coil apparatus 78 is shown. The adjustable MRI head coil apparatus 78 is depicted in an open position in FIG. 3. Common reference numbers are used to identify identical components between FIGS. 1, 2, and 3.

Referring now to both FIG. 2 and FIG. 3, the adjustable MRI head coil apparatus 78 includes a front plate 81, a back plate 82, a left plate 84, and a right plate 86. The adjustable MRI head coil apparatus 78 includes a fixture 88, an arm 90, a base 92, and a hose 94. Each of the plates 81, 82, 84, 86 includes a plurality of RF receive elements arranged in an array. According to an embodiment, the front plate 81 and the back plate 82 may each include between 6 RF receive elements, while each of the side plates 84, 86 may include 10 RF receive elements. Other embodiments may use a different number of RF receive elements in each of the plates. For example, the front plate 81 and the back plate 82 may each include 6 to 8 RF receive elements and the side plates 84, 86 may each include 8 to 10 RF receive elements. According to an embodiment, the RF receive elements may each be generally similar in size and generally rectangular in shape. However, according to other embodiments, the RF receive elements may be different shapes. For example, one or more of the receive elements may be a different shape including circular, oval, hexagonal, or any other shape. The RF receive elements are formed from a conductor such as copper and each of the plates 81, 82, 84, 86 rigidly locks the RF receive elements into a fixed orientation.

Figure 4:
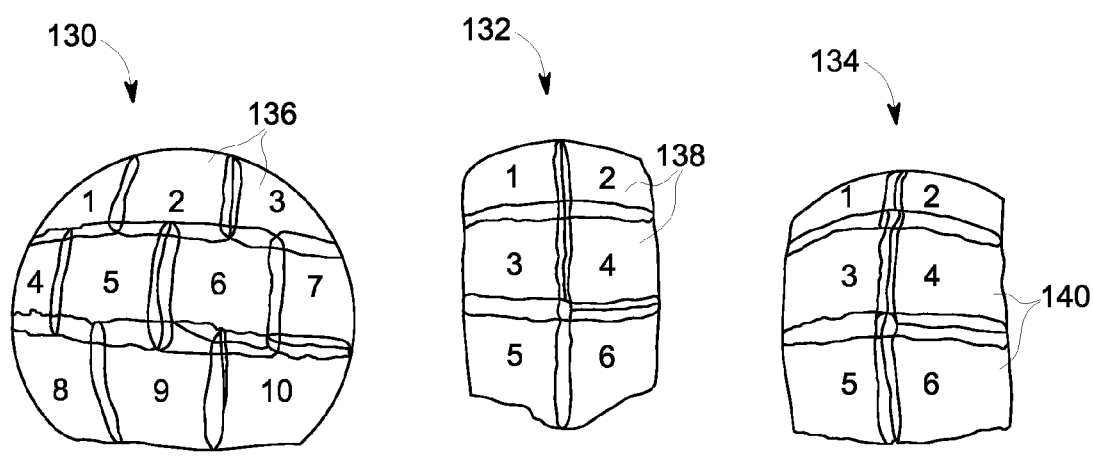
FIG. 4 is a schematic representation of a perspective view of the RF receive element orientation of a side plate, a front plate, and a back plate in accordance with an embodiment.

FIG. 4 is a schematic representation of a perspective view of the RF receive element orientation of a side plate 130, a front plate 132, and a back plate 134 in accordance with an embodiment. The side plate 130, the front plate 132, and the back plate are represented as discrete components in a disassembled fashion to better illustrate the RF receive element orientation. According to an exemplary embodiment, the complete adjustable MRI head coil apparatus would include the side plate 130, a minor image of the side plate 130, the front plate 132, and the back plate 134 to substantially surround a patient's head.

The side plate 130 includes 10 generally rectangular RF receive elements 136. Each of the RF receive elements 136 is identified with a number from 1 to 10. The front plate 132 includes 6 RF receive elements 138. Each of the RF receive elements 138 is labeled with a number from 1 to 6. The back plate 134 also includes 6 RF receive elements 140 according to the illustrated embodiment. Each of the RF receive elements 140 is labeled with a number from 1 to 6. In each of the plates illustrated in FIG. 4, the RF receive elements partially overlap the adjacent RF receive elements. For example, looking at the side plate 130, RF receive element 2 partially overlaps RF receive element 1, RF receive element 3, RF receive element 5, and RF receive element 6. It should be appreciated that FIG. 4 is a perspective view and that the RF receive elements in each of the plates 130, 132, and 134 are arranged to form a shape that is concave on a first side and convex on the opposite side in order to better conform to a patient's head.

Referring back to FIGS. 2 and 3, the patient 70 is included in FIGS. 2 and 3 to illustrate how the adjustable MRI head coil apparatus 78 fits in relation to the patient's head 96. For example, the front plate 81 is adapted to fit on the front of a the patient's head 96. The front plate 81 may be shaped to define two eye cutouts 97. Each of the eye cutouts 97 is configured to fit over the patient's eyes while the MRI head coil apparatus 78 is in its closed position as shown in FIG. 2. The eye cutouts 97 allow the patient 70 to view his surroundings while the MRI head coil apparatus 78 is in a closed position and may help to alleviate feelings of claustrophobia in a percentage of patients. The front plate 81, may also be contoured to accommodate the patient's nose. For example, the front plate 81 is shaped to form a bridge 99 that fits over the patient's nose. This allows the RF receive elements in the front plate 81 to fit more closely to the patient's head. In other embodiments, the front plate 81 may be shaped so that it does not extend all the way to the patient's nose. According to yet other embodiments, the plates of the adjustable MRI head coil apparatus may be made of a transparent material, such as a transparent plastic. Eye cutouts may not be necessary according to these embodiments.

The front plate 81 is connected to a first pivot 98 by a first arm 100. The first pivot 98 allows the first arm 100 and the front plate 81 to rotate between an open position as shown in FIG. 3 and a closed position as shown in FIG. 2. The left plate 84 is connected to second pivot 102 by a second arm 104. The right plate 86 is connected to a third pivot 106 by a third arm 108. The back plate 82 is connecting to a fourth pivot 107 by a fourth arm 109. The left plate 84 is adapted to fit on the left side of the patient's head 96. The right plate 84 is adapted to fit on the right side of the patient's head 96. The back plate 82 is adapted to fit on the back of the patient's head 96. According to an embodiment, the left plate 84, the right plate 86, and the back plate 82 may each be concave in order to more closely conform to the contours of the patient's head.

According to an embodiment, each of the plates 81, 82, 84, 86 is connected to the fixture 88. The fixture 88 may be mounted to the arm 90, which is configured to be translated through the base 92. According to another embodiment, the fixture 88 and the arm 90 may be one integral component. The MRI head coil apparatus 78 includes an actuator mechanism 112. The actuator mechanism 112 may include a pneumatic circuit, or a hydraulic circuit, or one or more motors in accordance with various embodiments. According to the embodiment shown in FIGS. 2 and 3, the actuator mechanism 112 is a pneumatic circuit. The actuator mechanism 112 includes a pressurized vessel (not shown) that holds compressed air, the hose 94 through which the compressed air travels, and fittings connected to each of the plates 81, 82, 84, 86. The actuator mechanism 112 includes one or more valves that direct compressed air to one or more of the plates 81, 82, 84, 86. Specifically, by varying the air pressure to portions of the pneumatic circuit connected to specific plates 81, 82, 84, 86, the actuator mechanism may control the angular position of each of the plates 81, 82, 84, 86 with respect to each other and the fixture 88. That is, the actuator mechanism 112 controls the angular position of the front plate 80 about the first pivot 98, the left plate 84 about the second pivot 102, the right plate 86 about the third pivot 106, and the back plate 82 about the fourth pivot 107. According to other embodiments, the actuator mechanism 112 may include a pneumatic circuit, a hydraulic circuit, or a plurality of motors, for example servo motors, attached to each of the plates 81, 82, 84, 86. For embodiments using a plurality of motors, it should be appreciated that each of the motors may be individually attached to each of the plates 81, 82, 84, 86, or each motor may be connected to two or more of the plates by a linkage mechanism (not shown). For example, a linkage mechanism may allow a single motor to control the angular position of all of the plates 81, 82, 84, 86 at the same time.

Still referring to FIGS. 2 and 3, the arm 90 may be adapted to be translated through the base 92 in a linear manner. For example, in FIG. 3, the arm 90 is shown in a retracted position further away from the patient's head 96, while in FIG. 2, the arm 90 is shown in an extended position closer to the patient's head 96. The position of the arm 90 may be adjusted by a stepper motor (not shown) or through the actuator mechanism 112. According to an embodiment, the actuator mechanism 112 may include a pneumatic circuit configured to control the position of the arm 100 with respect to the base 92.

The arm 90 may also be configured to allow rotation about its longitudinal axis 114. The patient 70 is shown in a supine position. However, for some types of MRI scans it may be desirable to have the patient in a prone position or lying on his side. As described previously, each of the plates is shaped to fit over a specific portion of the patient's head. Since all of the plates are attached to the fixture 88, which is in turn attached to the arm 90, rotating the arm 90 about it longitudinal axis 114 allows the adjustable MRI head coil apparatus 78 to accommodate patients in the prone position, supine position, or side positions, as well as any intermediate positions. The rotational position of the arm 90 may be controlled by the actuator mechanism 112 or by a separate motor.

The adjustable MRI head coil apparatus 78 may include a sensor 116 attached to or integrated into one or more of the plates 81, 82, 84, 86. The sensor 116 may be a pressure sensor, a capacitive sensor, a laser sensor or any other sensor configured to determine either distance or pressure of the plates 81, 82, 84, 86 with respect to the patient 70. The fitting of the adjustable MRI head coil apparatus 78 to the patient 70 may be manual, partially automatic, or fully automatic depending on the embodiment.

According to an embodiment where the adjustable MRI head coil apparatus 78 is automatically adjusted to fit the patient 70, an operator may start the fitting of the adjustable MRI head coil apparatus 78 by, for example, initiating the process through an input in the control panel 14 (shown in FIG. 1). The adjustable MRI head coil apparatus 78 may be in an open position like that shown in FIG. 3. The actuator mechanism 112 may start by translating the plates in the longitudinal direction by moving the arm 90 through the base 92. According to an embodiment, the patient's head 96 may be placed on a support 118 (shown in FIG. 2). The support 118 may be a known distance from the base 92 and, therefore, the processor 80 (shown in FIG. 1) may determine the appropriate distance to translate the plates. According to other embodiments, the processor 80 may rely on data from an additional sensor (not shown) to determine the location at which to stop the translation of the arm 90. According to another embodiment, the adjustable MRI head coil apparatus 78 may be mounted within the bore of superconducting magnet 54 (shown in FIG. 1) of the MRI system 10 (shown in FIG. 1). As such, the adjustable MRI head coil apparatus 78 may be configured to be positioned at the isocenter, or field-of-view of the MRI system. For example, according to an exemplary embodiment, the adjustable MRI head coil apparatus 78 may be mounted at the isocenter of the MRI system. If the adjustable MRI head coil apparatus 78 is mounted at the isocenter of the MRI system, then the adjustable MRI head coil apparatus may remain at the isocenter of the MRI system even while the patient is removed from the MRI system. Having the adjustable MRI head coil apparatus 78 at the isocenter may be advantageous because it is possible to tune the MRI system while the adjustable MRI head coil apparatus 78 is in a known position. According to other embodiments, the adjustable MRI head coil apparatus 78 may not have an arm like arm 90 to translated the plates 81, 82, 84, 86. Instead, in other embodiments, the translation of the table 49 (shown in FIG. 1) may be used to position the patient at the right position with respect to the adjustable MRI head coil apparatus.

According to other embodiments, the adjustable MRI head coil apparatus 78 may be configured for use with an MRI/PET hybrid system. In typical MRI/PET studies, first an MRI image is acquired to provide anatomical information and then a PET image is acquired to provide function information, typically regarding the uptake of a radiopharmaceutical such as fluorodeoxyglucose (FDG). The MRI image and the PET image may then be registered and fused in order to provide a radiologist or an oncologist with an image showing both the anatomical data and the functional data. For a typical MRI/PET studies, it may be necessary to translate the patient from the MRI portion of the MRI/PET hybrid system to the PET portion of the MRI/PET hybrid system. According to an embodiment, the adjustable MRI head coil apparatus 78 may be particularly well-suited for MRI/PET studies because the adjustable MRI head coil apparatus 78 holds the patient's head in fixed position. Additionally, the plates of adjustable MRI head coil apparatus 78 may be made of materials and thicknesses to only minimally attenuate gamma rays used by the PET system to generate an image.

Next, the processor 80 (shown in FIG. 1) may control the actuator mechanism 112 to move each of the plates 81, 82, 84, 86 from the open to the closed position. The actuator mechanism 112 may move the plates by adjusting the air pressure within the pneumatic circuit to move each of the plates 81, 82, 84, 86. The processor 80 receives feedback from each of the sensors 116 positioned on the plates 81, 82, 84, 86. The sensors 116 are configured to detect either when the plates 81, 82, 84, 86 are at a predetermined distance from the patient's head 96 or when the plates 81, 82, 84, 86 are contacting the patient 70 at a predetermined level of pressure. Ideally, each of the plates 81, 82, 84, 86 will be lightly in contact with the patient's head 96 for optimum image quality. When the plates 81, 82, 84, 86 are at the appropriate position with respect to the patient's head 96, the processor 80 controls the actuator mechanism 112 to stop moving the plates.

As is visible in FIG. 2, the front plate 81, the back plate 82, and the right plate 86 are all shaped to fit together in a complementary manner. While not visible in FIG. 2, the left plate 84 is also shaped to fit together with the front plate 81 and the back plate 82 in a complementary manner. In other words, the front plate 81, the back plate 82, the left plate 84, and the right plate 86 are shaped so that they interface with each other in the closed position in order to form a continuous or nearly continuous array of RF receive elements around the patient's head. Once in the appropriate positions, the actuator mechanism 112 locks the positions of the plates for the imaging process. By locking the position of the plates it is easier to keep the patient's head 96 in a static position while obtaining MRI image data. Keeping the patient's head 96 still during the imaging process aids with image quality, particularly because some MRI acquisition sequences may last several minutes or longer.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

We claim:

1. An adjustable MRI head coil apparatus comprising:
   a fixture;
   a plurality of plates, each of the plurality of plates comprising a plurality of RF receive elements arranged in a fixed orientation, wherein each of the plurality of plates is attached to the fixture, wherein the plurality of plates includes a front plate, a left plate, a right plate, and a back plate;
   an actuator mechanism configured to adjust the relative position of each of the plurality of plates in order to allow the plurality of plates to fit a variety of different patient head sizes; and
   an arm coupled between the actuator mechanism and the fixture, the arm being supported by a base and attached to the fixture, wherein the arm is adapted to be translated along a longitudinal axis with respect to the base, and wherein the arm is configured to be rotated about the longitudinal axis in order to accommodate the heads of patients in different orientations including prone, supine, and lying on a side;
   wherein the front plate is connected to a first pivot on the fixture by a first arm;
   wherein the left plate is connected to a second pivot on the fixture by a second arm;
   wherein the right plate is connected to a third pivot on the fixture by a third arm; and
   wherein the back plate is connected to a fourth pivot on the fixture by a fourth arm.

2. The adjustable MRI head coil apparatus of claim 1, wherein the adjustable MRI head coil apparatus is configured to be mounted at the isocenter of an MRI system.

3. The adjustable MRI head coil apparatus of claim 1, wherein the adjustable MRI head coil apparatus is configured for use within a PET/MRI hybrid system.

4. An adjustable MRI head coil apparatus comprising:
   a fixture;
   a front plate comprising a first plurality of RF receive elements;
   a first arm connecting the front plate to a first pivot on the fixture;
   a left plate comprising a second plurality of RF receive elements;
   a second arm connecting the left plate to a second pivot on the fixture;
   a right plate comprising a third plurality of RF receive elements;
   a third arm connecting the right plate to a third pivot on the fixture;
   a back plate comprising a fourth plurality of RF receive elements;
   a fourth arm connecting the back plate to a fourth pivot on the fixture;
   an actuator mechanism configured to adjust the position of the front plate, the left plate, and the right plate with respect to the fixture; and
   an arm coupled between the actuator mechanism and the fixture, the arm being supported by the base and attached to the fixture, wherein the arm is adapted to be translated along a longitudinal axis with respect to the base, and wherein the arm is configured to be rotated about the longitudinal axis in order to accommodate the heads of patients in different orientations including prone, supine, and lying on a side;
   wherein the fixture is mounted to the arm and configured to be linearly translated with respect to the base.

5. The adjustable MRI head coil apparatus of claim 4, wherein the actuator mechanism comprises a hydraulic circuit.

6. The adjustable MRI head coil apparatus of claim 4, wherein the actuator mechanism comprises a pneumatic circuit.

7. The adjustable MRI head coil apparatus of claim 4, further comprising a sensor system comprising a sensor positioned on each of the plates, wherein the sensor system is configured to detect when the plates are at a specific position with respect to a patient's head.

8. The adjustable MRI head coil apparatus of claim 7, further comprising a processor connected to the actuator mechanism and the sensor system, wherein the processor is configured to automatically adjust the positions of the front plate, the left plate, and the right plate with respect to the fixture in order to place the plates at the appropriate distances from the patient's head for imaging.

9. The adjustable MRI head coil apparatus of claim 4, wherein the back plate is connected to the actuator mechanism by a fourth pivot.

10. An MRI system comprising:
    a superconducting magnet configured to generate a B0 field;
    an RF body coil disposed inside the superconducting magnet; and
    an adjustable MRI head coil apparatus comprising:
      a fixture;
      a plurality of plates attached to the fixture, wherein each of the plurality of plates comprises a plurality of RF receive elements arranged in a fixed orientation, wherein the plurality of plates includes a front plate, a left plate, a right plate, and a back plate;
      an actuator mechanism configured to adjust the relative positioning of each of the plurality of plates with respect to the fixture in order to allow the plurality of plates to fit a variety of different patient head sizes; and
      an arm coupled between the actuator mechanism and the fixture, the arm being supported by the base and attached to the fixture, wherein the arm is adapted to be translated along a longitudinal axis with respect to the base, and wherein the arm is configured to be rotated about the longitudinal axis in order to accommodate the heads of patients in different orientations including prone, supine, and lying on a side;
      wherein the front plate is connected to a first pivot on the fixture by a first arm;
      wherein the left plate is connected to a second pivot on the fixture by a second arm;
      wherein the right plate is connected to a third pivot on the fixture by a third arm; and
      wherein the back plate is connected to a fourth pivot on the fixture by a fourth arm.

11. The MRI system of claim 10, wherein the adjustable MRI head coil apparatus is mounted at the isocenter of the superconducting magnet, and wherein the adjustable MRI head coil apparatus is configured to be adjusted to accommodate a patient without removing the adjustable MRI head coil apparatus from the isocenter of the superconducting magnet.

12. The MRI system of claim 10, further comprising a user interface attached to the actuator mechanism, wherein the user interface is configured to control the position of each of the plurality of plates of the adjustable MRI head coil apparatus.

13. The MRI system of claim 10, further comprising a processor connected to the actuator mechanism, wherein the processor is configured to automatically control the position of each of the plurality of plates of the adjustable MRI head coil apparatus with respect to a patient's head.

14. The MRI system of claim 13, further comprising a sensor system connected to each of the plurality of plates and to the processor, wherein the sensor system is adapted to provide feedback regarding the position of each of the plurality of plates with respect to the patient's head.

15. The MRI system of claim 11, wherein the actuator mechanism is connected to each of the plurality of plates.

16. The adjustable MRI head coil apparatus of claim 1, wherein the front plate is adapted to fit on the front of a patient's head.

17. The adjustable MRI head coil apparatus of claim 16, wherein the left plate is adapted to fit on the left side of the patient's head.

18. The adjustable MRI head coil apparatus of claim 17, wherein the right plate is adapted to fit on the right side of the patient's head.

19. The adjustable MRI head coil apparatus of claim 18, wherein the back plate is adapted to fit on the back of the patient's head.

20. The adjustable MRI head coil apparatus of claim 19, wherein the front plate, the back plate, the left plate, and the right plate comprise complementary shapes that fit together in order to substantially surround the patient's head.

\* \* \* \* \*